(12) United States Patent
Yi-Li et al.

(10) Patent No.: US 7,811,938 B2
(45) Date of Patent: Oct. 12, 2010

(54) METHOD FOR FORMING GAPS IN MICROMECHANICAL DEVICE AND MICROMECHANICAL DEVICE

(75) Inventors: Cheng-Rong Yi-Li, Beijing (CN); Qun-Qing Li, Beijing (CN); Shou-Shan Fan, Beijing (CN)

(73) Assignees: Tsinghua University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 149 days.

(21) Appl. No.: 12/248,804

(22) Filed: Oct. 9, 2008

(65) Prior Publication Data

US 2009/0160028 A1 Jun. 25, 2009

(30) Foreign Application Priority Data

Dec. 19, 2007 (CN) .................. 2007 1 0125261

(51) Int. Cl.
*H01L 21/311* (2006.01)
(52) U.S. Cl. .................. 438/694; 438/704; 438/455; 438/754; 257/618; 257/619; 257/E21.215; 257/E23.002

(58) Field of Classification Search .............. 438/694, 438/704, 455, 754; 257/618, 619, E21.215, 257/E23.002
See application file for complete search history.

(56) References Cited

U.S. PATENT DOCUMENTS

2010/0133109 A1* 6/2010 Cohen et al. ................ 205/118

* cited by examiner

*Primary Examiner*—Jarrett J Stark
*Assistant Examiner*—Wilner Jean Baptiste
(74) *Attorney, Agent, or Firm*—D. Austin Bonderer

(57) ABSTRACT

An exemplary method for forming gaps in a micromechanical device includes providing a substrate. A first material layer is deposited over the substrate. A sacrificial layer is deposited over the first material layer. A second material layer is deposited over the sacrificial layer such that at least a portion of the sacrificial layer is exposed. The exposed portion of the sacrificial layer is etched by dry etching. The remaining portion of the sacrificial layer is etched by wet etching to form gaps between the first material layer and the second material layer. One or more bulges are formed at one side of the second material layer facing the first material layer, and are a portion of the sacrificial layer remaining after the wet etching.

19 Claims, 3 Drawing Sheets

METHOD FOR FORMING GAPS IN MICROMECHANICAL DEVICE AND MICROMECHANICAL DEVICE

BACKGROUND

1. Field of the Invention

The invention relates to semiconductor methods and micromechanical structures and, particularly, to a method for forming gaps in a micromechanical device and a micromechanical device with the gaps.

2. Description of Related Art

Micromachining technology, and in particular, microelectromechanical systems (MEMS) technology, is usually applied to size gaps in the microscale device to allow it to respond to mechanical stimulation. In the microscale device, gaps are usually formed between two different material layers. Typically, a sacrificial layer is employed to form such gaps. In practice, the sacrificial layer is deposited between two different material layers, and then portions of the sacrificial layer are removed by etching, such as wet etching to form gaps.

Wet etching is chemical etching in which a substrate is immersed in a bath of etchant. Because the materials that can be dissolved by the etchant will be removed and the other materials will not be damaged, a gap is formed between layers. Thus, wet etching offers advantages of high selectivity. However, etchants employed by wet etching are usually isotropic, that is, they erode material equally in all directions. Therefore, a pattern fabricated by wet etching is usually not easily controlled.

Dry etching refers to the removal of materials by exposing the material to ion bombardment. Unlike wet etching, dry etching typically etches anisotropically, considerably preferable to modern processes because of sharp, well-controlled features. However, dry etching has no selectivity for etching materials and process is complicated causing difficulties for mass production.

With improvement of micromachining technology, there is an ongoing demand for microscale devices with thin and light structures to improve performance. Consequentially, there is a need for manufacture of equally scaled gaps in devices. However, some problems occur when etching thinner sacrificial layers by conventional wet or dry etching. The precision of microscale structure is difficult to satisfy with wet etching. In addition, under such conditions, two material layers at opposite sides of the sacrificial layer are more likely to adhere to each other if a thinner sacrificial layer has been etched. Alternatively, because dry etching such as reactive ion etching (RIE), normally utilizes high energy, materials other than those of the sacrificial layer will be damaged by ion bombardment. Namely, such unexpected failures can create defects in the micrometer device.

What is needed, therefore, is a method for forming gaps in a micromechanical device and a micromechanical device that provide simpler process and avoid the unexpected failures discussed.

SUMMARY

A method for forming gaps in a micromechanical device includes providing a substrate, depositing a first material layer over the substrate, a sacrificial layer over the first material layer, and a second material layer over the sacrificial layer such that at least a portion of the sacrificial layer is exposed, dry etching the exposed portion of the sacrificial layer, and wet etching the remaining portion of the sacrificial layer to form gaps between the first material layer and the second material layer, and form one or more bulges at one side of the second material layer facing the first material layer, and the bulges are a portion of the sacrificial layer remaining after the wet etching.

Other novel features and advantages of the present method for forming gaps in micromechanical device and micromechanical device will become more apparent from the following detailed description of exemplary embodiments, when taken in conjunction with the accompanying drawings.

BRIEF DESCRIPTION OF THE DRAWINGS

Many aspects of the present method for forming gaps in micromechanical device and micromechanical device can be better understood with reference to the following drawings. The components in the drawings are not necessarily drawn to scale, the emphasis instead being placed upon clearly illustrating the principles of the present method for forming gaps in micromechanical device and micromechanical device.

Figure 1:
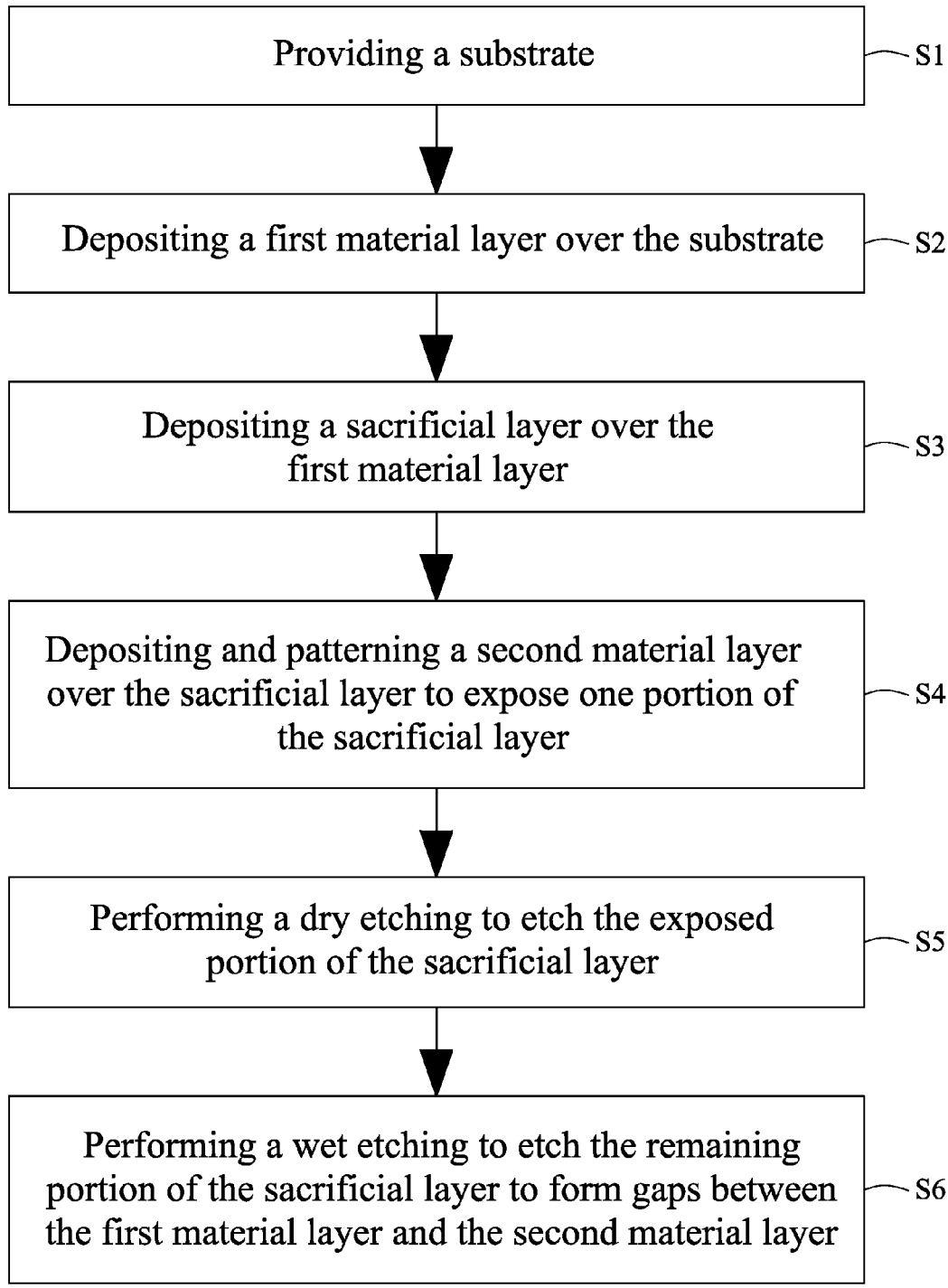
FIG. 1 is a flowchart of a method for forming gaps in a micromechanical device.

Corresponding reference characters indicate corresponding parts throughout the several views. The exemplifications set out herein illustrate at least one embodiment of the present method for forming gaps in micromechanical device and micromechanical device, in one form, and such exemplifications are not to be construed as limiting the scope of the invention in any manner.

DETAILED DESCRIPTION

Reference will now be made to the drawings to describe various embodiments of the present refractive-index sensor, in detail.

Figure 2:
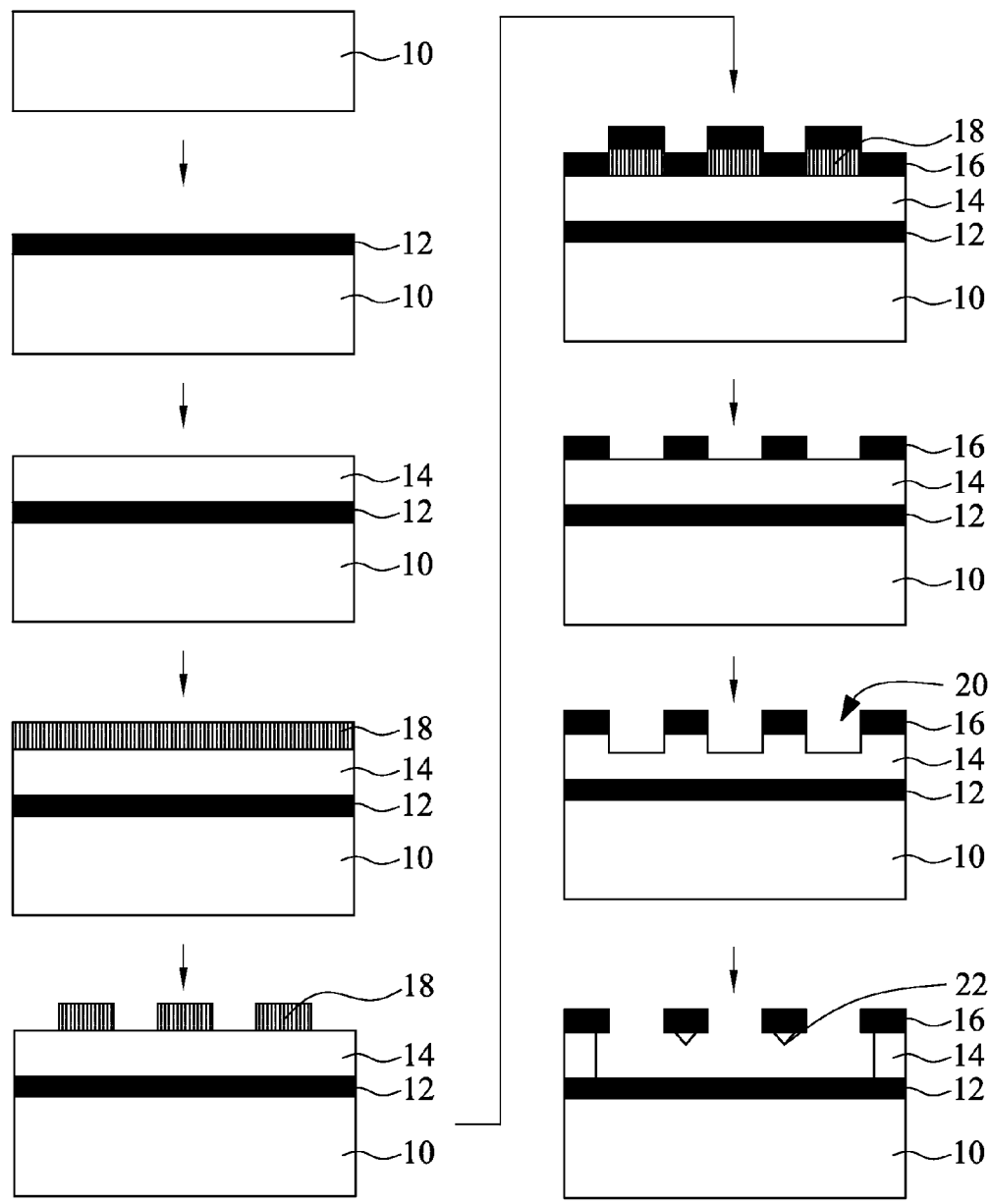
FIG. 2 is a schematic diagram of a micromechanical device with gaps formed therein.

Referring to FIG. 1 and FIG. 2, a method for forming gaps in a micromechanical device, according to an exemplary embodiment, includes providing a substrate 10. The first material layer 12 is then deposited over the substrate 10. The sacrificial layer 14 is deposited over the first material layer 12. The second material layer 16 is deposited and patterned over the sacrificial layer 14 to expose one portion thereof. The exposed portion of sacrificial layer 14 is dry etched. The remaining portion of the sacrificial layer 14 is wet etched to form gaps between the first material layer 12 and the second material layer 16, wherein a plurality of bulges 22 are formed at one side of the second material layer 16 facing the first material layer 12, and are a portion of the sacrificial layer remaining after the wet etching.

Details of the method follow.

In Step (a), the provided substrate 10 preferably includes silicon.

In step (b), the first material layer 12 is formed over the substrate 10 by, for example, plasma enhanced chemical vapor deposition (PECVD) or low pressure chemical vapor deposition (LPCVD). Suitably, the first material layer 12 is deposited by PECVD. In the exemplary embodiment, the first material layer 12 is metal, alloy, or composite material. While most preferably, the first material layer 12 is copper (Cu) of a thickness of about 100 nm, the disclosure is not limited thereto.

Step (c) involves forming the sacrificial layer 14 over the first material layer 12 by, for example, PECVD or LPCVD. In addition, the sacrificial layer 14 includes silicon dioxide (SiO$_2$) or metal. In the exemplary embodiment, a thickness of the sacrificial layer 14 is usually chosen corresponding to the width of the gaps to be formed. For example, the thickness of the sacrificial layer 14 should exceed or equal 10 nm. Particularly, the thickness of the sacrificial layer 14 is about 4 µm.

Step (d) involves forming the patterned second material layer 16 over the sacrificial layer 14 to expose one portion of the sacrificial layer 14. In the exemplary embodiment, the second material layer 16 is patterned based on, for example, resist lift-off technology. In step (d), the patterned second material layer 16 is formed by, first, disposal of a photoresist layer 18 on the sacrificial layer 14. Parts of the photoresist layer 18 are patterned using photolithography. The patterned photoresist layer 18 serves as a mask facilitating formation of the patterned secondary material layer 16. The patterned photoresist layer 18 exposes a portion of the sacrificial layer 14. Then, the second material layer 16 is deposited by, for example, PECVD or LPCVD, on the patterned photoresist layer 18 and on the exposed sacrificial layer 14. After that, the formed structure is immersed in organic solution, such as acetone, carbon tetrachloride, or chloroform. Suitably, acetone is employed in the exemplary embodiment. The organic solution removes the patterned photoresist layer 18 and portions of second material layer 16 disposed on the patterned photoresist layer 18. Thus, the patterned second material layer 16 is obtained and the portion of the sacrificial layer 14 is exposed by the patterned second material layer 16.

In the exemplary embodiment, the second material layer 16 is metal, alloy or composite material, particularly, metal such as Cu. In addition, a thickness of the second material layer 16 is, but is not limited to, about 100 nm. It is noted that the thickness of the second material layer 16 should be less than that of the photoresist layer 18. Thus, during formation of the patterned second material layer, the second material layer 16 on the exposed sacrificial layer 14 is kept from adhering to the second material layer 16 on the patterned photoresist layer 18.

In Step (e), dry etching cuts into the sacrificial layer 14 unprotected by the patterned second material layer 16. That is, a portion of the sacrificial layer 14 is removed to form a plurality of recesses 20 penetrating a predetermined depth into the sacrificial layer 14. Rather opportunely, the predetermined depth is in an approximate range from ⅓ to ⅘ the thickness of the sacrificial layer 14. In addition, the dry etching is reactive ion etching (RIE), chemically assisted beam etching (CAIBE), or magnetron enhanced reactive ion etching (MERIE).

During the dry etching process, because the sacrificial layer 14 is exposed to ion bombardment, which is usually accompanied by high energy, byproducts derived from the sacrificial layer 14 are formed. In addition, such byproducts adhere to a sidewall of each of the recesses 20. As a result, a protective layer of the byproducts is formed on the sidewall of the recess 20.

The wet etching of Step (f) etches the remaining portion of the sacrificial layer 14. In practice, the structure obtained from Step (e) is dipped into a selected etchant for from about three minutes to about one hour. Therefore, the selected etchant undercuts the second material layer 16 and erodes the sacrificial layer 14 to form gaps therebetween. Deionized water is then employed to rinse and wash the structure etched by the selected etchant and gas, such as nitrogen, is utilized to dry the formed structure. In the exemplary embodiment, the selected etchant is a buffered solution, comprising a mixture of a buffering agent, such as hydrofluoric acid (HF), ammonium hydroxide (NH$_4$OH), or ammonium fluoride (NH$_4$F). In addition, the selected etchant has a pH value from 3 to 4.5. For example, the selected etchant can be a mixture of HF and NH$_4$OH, with a pH value of about 4.

In step (f), because the protective layer is formed on the sidewall of each of the recesses 20, the vertical etching rate will be different from the horizontal. Particularly, etching of the sidewall of recess 20 is slower than that of the bottom wall of the recess 20. Thus, when wet etching is complete, the etchant fully erodes a vertical portion of the sacrificial layer 14 and leaves a portion of the sacrificial layer 14 on the second material layer 16. Referring to FIG. 2, bulges 22, i.e. the remaining portion of sacrificial layer 14, are formed at the side of the second material layer 16 facing the first material layer 12. However, the size of the bulges 22 can be controlled approximately corresponding to the etching time. As mentioned, etching the sacrificial layer 14 to form gaps and bulges 22, prevents the first material layer 12 from adhering to the second material layer 16.

Figure 3:
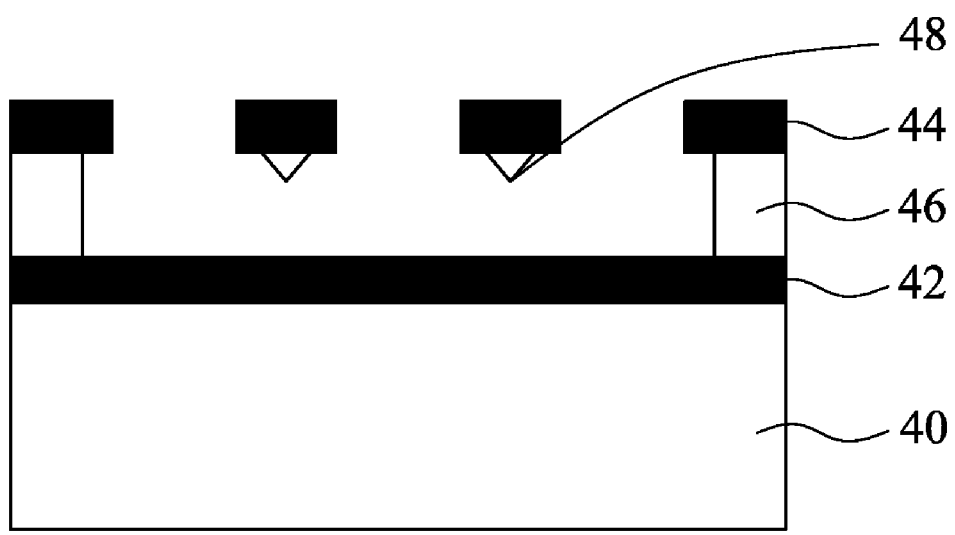
FIG. 3 is a cross-section of a micromechanical device in accordance with an exemplary embodiment.

Referring to FIG. 3, a micromechanical device 4, created by the method described above, is shown. The micromechanical device 4 includes a substrate 40, a first material layer 42 and a second material layer 44. In the exemplary embodiment, the micromechanical device 4 is a microelectromechanical system (MEMS) device.

The first material layer 42 is disposed over the substrate 40. The second material layer 44 is suspended over the first material layer 42. The second material layer 44 is patterned and is supported by a sacrificial layer 46. One or more of bulges 48 of the sacrificial layer 46 is suspended over the first material layer 42.

As materials and the features of the substrate 40, the first material layer 42, the sacrificial layer 46 and the second material layer 44 are substantially the same as disclosed previously, detailed description thereof is omitted for brevity.

Finally, it is to be understood that the embodiments described are intended to illustrate rather than limit the invention. Variations may be made to the embodiments without departing from the spirit of the invention as claimed. The embodiments illustrate the scope of the invention but do not restrict the scope of the invention.

It is also to be understood that above description and the claims drawn to a method may include some indication in reference to certain steps. However, the indication used is only to be viewed for identification purposes and not as a suggestion as to an order for the steps.

What is claimed is:

1. A method for forming gaps in a micromechanical device, the method comprising:
   providing a substrate;
   depositing a first material layer over the substrate, a sacrificial layer over the first material layer, and a second material layer over the sacrificial layer such that at least a portion of the sacrificial layer is exposed;
   dry etching to etch the exposed portion of the sacrificial layer; and
   wet etching to etch the remaining portion of the sacrificial layer to form gaps between the first material layer and the second material layer, and form one or more bulges at one side of the second material layer facing the first material layer, and the bulges are a portion of the sacrificial layer remaining after the wet etching.

2. The method as claimed in claim 1, wherein the substrate comprises silicon.

3. The method as claimed in claim 1, wherein the first material layer is metal, alloy or composite material.

4. The method as claimed in claim 1, wherein the second material layer is metal, alloy or composite material.

5. The method as claimed in claim 1, wherein the bulges are the same material as the sacrificial layer.

6. The method as claimed in claim 1, wherein the sacrificial layer comprises silicon dioxide or metal.

7. The method as claimed in claim 1, wherein the sacrificial layer is more than or equal to 10 nm thick.

8. The method as claimed in claim 1, wherein deposition of the second material layer over the sacrificial layer comprises:
   disposing a photoresist layer over the sacrificial layer;
   patterning the photoresist layer to expose at least one portion of the sacrificial layer;
   further depositing the second material layer over the patterned photoresist layer and the exposed portion of sacrificial layer; and
   removing the photoresist layer and any of the second material layer on the photoresist layer.

9. The method as claimed in claim 8, wherein the photoresist layer and the portion of the second material layer on the photoresist layer are removed by an organic solution.

10. The method as claimed in claim 8, wherein the photoresist layer is thicker than the second material layer.

11. The method as claimed in claim 1, wherein the dry etching forms a plurality of recesses penetrating a predetermined depth into the sacrificial layer.

12. The method as claimed in claim 11, wherein the predetermined depth is from $\frac{1}{5}$ to $\frac{4}{5}$ the thickness of the sacrificial layer.

13. The method as claimed in claim 11, wherein the dry etching forms a protective layer on a sidewall of each of the recesses.

14. The method as claimed in claim 13, wherein a velocity of etching the sidewall of the recesses is slower than a velocity of etching a bottom wall of each of the recesses.

15. The method as claimed in claim 11, wherein the step of wet etching is executed by dipping a selected etchant into the remaining portion of the sacrificial layer for about three minutes to about one hour.

16. The method as claimed in claim 15, wherein the selected etchant is a buffered solution.

17. The method as claimed in claim 16, wherein the buffered solution comprises a mixture of a buffering agent.

18. The method as claimed in claim 17, wherein the buffering agent is hydrofluoric acid, ammonium hydroxide, or ammonium fluoride.

19. The method as claimed in claim 16, wherein the selected etchant has a pH value from about 3 to about 4.5.

* * * * *